United States Patent
Lee et al.

(10) Patent No.: US 9,282,612 B2
(45) Date of Patent: Mar. 8, 2016

(54) DUAL MODE ORGANIC LIGHT EMITTING DEVICE AND PIXEL CIRCUIT INCLUDING THE SAME

(75) Inventors: Bo-Ra Lee, Yongin (KR); Chang-Ho Lee, Yongin (KR); Il-Soo Oh, Yongin (KR); Jin-Young Yun, Yongin (KR); Hee-Joo Ko, Yongin (KR); Se-Jin Cho, Yongin (KR); Hyung-Jun Song, Yongin (KR); Young-Woo Song, Yongin (KR); Jong-Hyuk Lee, Yongin (KR); Sung-Chul Kim, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 898 days.

(21) Appl. No.: 13/470,078

(22) Filed: May 11, 2012

(65) Prior Publication Data
US 2013/0076251 A1 Mar. 28, 2013

(30) Foreign Application Priority Data
Sep. 23, 2011 (KR) .......................... 10-2011-0096420

(51) Int. Cl.
*H05B 33/08* (2006.01)
*H01L 51/52* (2006.01)

(52) U.S. Cl.
CPC ........ *H05B 33/0896* (2013.01); *H01L 51/5221* (2013.01); *H01L 2251/5353* (2013.01)

(58) Field of Classification Search
CPC .................... H05B 33/0896; H01L 51/5221
See application file for complete search history.

(56) References Cited

U.S. PATENT DOCUMENTS

| 6,322,908 | B1* | 11/2001 | Oda et al. ...................... 428/690 |
| 6,420,031 | B1* | 7/2002 | Parthasarathy et al. ..... 428/411.1 |
| 6,803,128 | B2* | 10/2004 | Lee .................................. 428/690 |
| 7,365,488 | B2* | 4/2008 | Lee et al. ...................... 313/506 |
| 7,396,598 | B2* | 7/2008 | Takeuchi et al. .............. 428/690 |
| 7,696,682 | B2* | 4/2010 | Kim et al. ..................... 313/503 |
| 8,617,722 | B2* | 12/2013 | Toba et al. .................... 428/690 |
| 2002/0146589 | A1* | 10/2002 | Akiyama et al. .............. 428/690 |

(Continued)

FOREIGN PATENT DOCUMENTS

| KR | 10-2006-0122334 A | 11/2006 |
| KR | 10-2009-0061613 A | 6/2009 |
| KR | 10-2009-0113607 A | 11/2009 |

OTHER PUBLICATIONS

Stössel et al., Impact of the cathode metal work function on the performance of vacuum-deposited organic light emitting-devices, Feb. 24, 1999, Springer-Verlag, Applied Physics A Materials Science & Processing, pp. 387-390.*

(Continued)

*Primary Examiner* — Thomas J Hiltunen
(74) *Attorney, Agent, or Firm* — Knobbe, Martens, Olson & Bear, LLP

(57) ABSTRACT

A dual mode organic light emitting device and a pixel circuit including the same are disclosed. The dual mode organic light emitting device includes a cathode formed over a substrate, an electron transport layer (ETL) formed over the cathode, an emission layer formed over the electron transport layer (ETL), and an anode formed over the emission layer, wherein the cathode includes a first metal selected from silver (Ag), aluminum (Al), copper (Cu), and gold (Au) and a second metal having a work function of about 4.0 eV or less, and the first metal and the second metal are present at a weight ratio of about 1:1 to about 1:100.

8 Claims, 6 Drawing Sheets

(56) References Cited

U.S. PATENT DOCUMENTS

| | | | |
|---|---|---|---|
| 2002/0168543 A1* | 11/2002 | Ishikawa et al. | 428/690 |
| 2004/0027143 A1 | 2/2004 | Odan et al. | |
| 2005/0058853 A1* | 3/2005 | Cosimbescu et al. | 428/690 |
| 2006/0038484 A1* | 2/2006 | Noh et al. | 313/499 |
| 2006/0269782 A1* | 11/2006 | Liao et al. | 428/690 |
| 2007/0001586 A1 | 1/2007 | Ryu et al. | |
| 2007/0134514 A1* | 6/2007 | Kondakov et al. | 428/690 |
| 2007/0139311 A1* | 6/2007 | Cho et al. | 345/76 |
| 2010/0026172 A1* | 2/2010 | Toba | 313/504 |
| 2010/0090589 A1 | 4/2010 | Itagaki et al. | |
| 2010/0264813 A1* | 10/2010 | Takahashi | 313/504 |
| 2011/0043102 A1* | 2/2011 | Lee et al. | 313/504 |
| 2011/0043435 A1* | 2/2011 | Hebenstreit et al. | 345/5 |
| 2011/0074838 A1* | 3/2011 | Yamamoto et al. | 345/690 |
| 2012/0012828 A1* | 1/2012 | Koh et al. | 257/40 |
| 2013/0026456 A1* | 1/2013 | Hwang et al. | 257/40 |
| 2013/0093800 A1* | 4/2013 | Shim et al. | 345/690 |
| 2014/0110686 A1* | 4/2014 | Fujita et al. | 257/40 |

OTHER PUBLICATIONS

Redecker et al., "25-1: Dual Mode OLED for Mobile Application," 25.1/M. Redecker, Email: michael.redecker@samsung.com, pp. 1-3, (2011).

* cited by examiner

DUAL MODE ORGANIC LIGHT EMITTING DEVICE AND PIXEL CIRCUIT INCLUDING THE SAME

CROSS-REFERENCE TO RELATED APPLICATIONS

This application claims priority to and the benefit of Korean Patent Application No. 10-2011-0096420 filed in the Korean Intellectual Property Office on Sep. 23, 2011, the entire contents of which are incorporated herein by reference.

BACKGROUND

1. Field

The disclosed technology relates to a dual mode organic light emitting device and a pixel circuit including the same.

2. Description of the Related Technology

An organic light emitting diode (OLED) includes an anode, a cathode, and an organic emission layer that is disposed between the anode and the cathode and emits light as a result of the re-combination of electrons and holes.

Recently, an organic light emitting device that operates in a dual mode has been developed. A dual mode organic light emitting device emits light in response to a forward direction voltage that is applied to the organic light emitting device in a normal mode, and emits light in response to a reverse direction voltage that is applied to the organic light emitting device in a reflective mode (which is also referred to as a quenching mode). The dual mode organic light emitting device is disclosed in U.S. Patent Publication No. US2004/027143.

Because the conventional dual mode organic light emitting device requires high driving voltage in the reflective mode, the power consumption of the device is high, and the life-span of the device is adversely affected.

SUMMARY OF CERTAIN INVENTIVE ASPECTS

One inventive aspect is a dual mode organic light emitting device, including a cathode formed over a substrate, an electron transport layer (ETL) formed over the cathode, and an emission layer formed over the electron transport layer (ETL). In addition, the device also includes an anode formed over the emission layer, where the cathode includes a first metal selected from silver (Ag), aluminum (Al), copper (Cu), and gold (Au) and a second metal having a work function of about 4.0 eV or less, and the first metal and the second metal are present at a weight ratio of about 11 to about 1100.

Another inventive aspect is a pixel circuit including a dual mode organic light emitting device including a cathode formed over a substrate, an electron transport layer (ETL) formed over the cathode, an emission layer formed over the electron transport layer (ETL), and an anode formed over the emission layer. The cathode includes a first metal selected from silver (Ag), aluminum (Al), copper (Cu), and gold (Au) and a second metal having a work function of about 4.0 eV or less, and the first metal and the second metal are present at a weight ratio between more than about 110 and about 1100 or less. The pixel circuit also includes a P-type driving transistor configured to apply a current to the cathode of the dual mode organic light emitting device, and a capacitor configured to apply a voltage corresponding to a data voltage to a gate of the driving transistor.

Another inventive aspect is a pixel circuit including a dual mode organic light emitting device including a cathode formed over a substrate, an electron transport layer (ETL) formed over the cathode, an emission layer formed over the electron transport layer (ETL), and an anode formed over the emission layer. The cathode includes a first metal selected from silver (Ag), aluminum (Al), copper (Cu), and gold (Au) and a second metal having a work function of about 4.0 eV or less, and the first metal and the second metal are present at a weight ratio between more than about 110 and about 1100 or less. The pixel circuit also includes an N-type driving transistor configured to apply a current to an anode of the dual mode organic light emitting device, and a capacitor configured to apply a voltage corresponding to a data voltage to a gate of the driving transistor.

DETAILED DESCRIPTION OF CERTAIN INVENTIVE EMBODIMENTS

Exemplary embodiments are hereinafter described in detail. However, these embodiments are only exemplary, and the present invention is not limited thereto.

The dual mode organic light emitting device according to one embodiment includes a cathode disposed on a substrate; an electron transport layer (ETL) disposed on the cathode; an emission layer disposed on the electron transport layer (ETL); and an anode disposed on the emission layer; wherein the cathode includes a first metal selected from silver (Ag), aluminum (Al), copper (Cu), and gold (Au) and a second metal having a work function of about 4.0 eV or less, and the first metal and the second metal are present at a weight ratio of about 1:1 to about 1:100.

The organic light emitting device may have the characteristics of both a normal mode and a reflective mode while decreasing a driving voltage. An organic light emitting device with improved driving voltage may be advantageous in terms of power consumption and device life-span.

Examples of the first metal may be silver or aluminum. The second metal may include magnesium (Mg), calcium (Ca), ytterbium (Yb), barium (Ba), or a combination thereof. The second metal may be magnesium. The first metal and the second metal are present at a weight ratio of about 1:1 to about 1:100. Within the range, the driving voltage may be decreased in a reflective mode. Specifically, the first metal and the second metal may be present at a weight ratio of about 1:1 to 1:30. More specifically, the first metal and the second metal may be present at a weight ratio of about 1:10 to about 1:100. Still more specifically, the first metal and the second metal may be present at a weight ratio of about 1:10 to about 1:30. Still more specifically, the first metal and the second metal may be present at a weight ratio between more than about 1:10 and about 1:30 or less.

Figure 1:
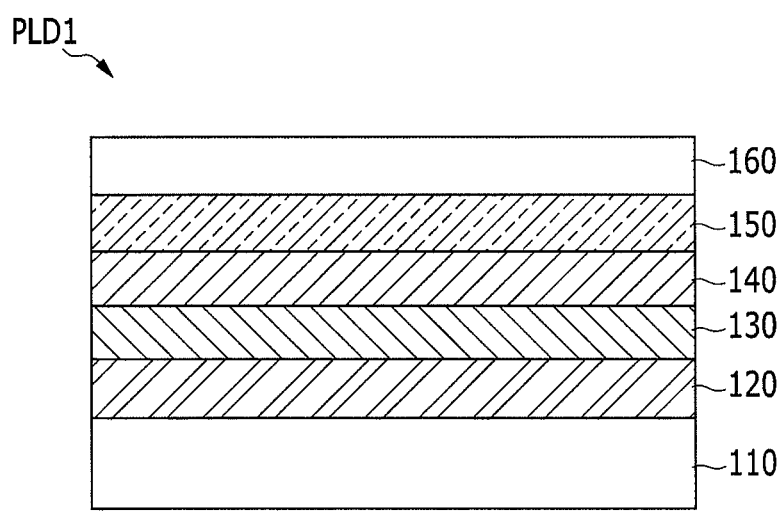
FIG. 1 is a cross-sectional view of an organic light emitting device according to one embodiment.

FIG. 1 is a cross-sectional view of an organic light emitting device according to one embodiment. Referring to FIG. 1, the organic light emitting device includes an emission layer 130 interposed between a pair of electrodes, which are an anode 110 and a cathode 160. A hole injection/transport layer 120 is interposed between the emission layer 130 and the anode 110.

The organic light emitting device in accordance with a first embodiment includes an electron acceptor layer 140, which contacts an emission layer 130 and is formed of a material selected from the group consisting of fullerene, methanofulleren, and a derivative thereof, and an electron injection layer (EIL) 150, which contacts a cathode, between an emission layer 130 and a cathode 160. The anode 110 and the cathode 160 may be formed of a material that does not implant electrons and holes to the emission layer 130 when a reverse direction bias is applied to the organic light emitting device.

Also, the anode 110 may be formed of a material that transmits light, has low sheet resistance, and has excellent fabrication workability. For example, the anode 110 may be formed of a transparent conductive material such as ITO (indium tin oxide) and IZO (indium zinc oxide). Also, it may further include a conductive reflective layer and an additional transparent conductive layer according to the light emitting direction of the organic light emitting device. The reflective layer improves electrical conductivity while increasing luminous efficiency. For example, the reflective layer may be formed of aluminum (Al), an aluminum-alloy (Al-alloy), silver (Ag), a silver-alloy (Ag-alloy), gold (Au), or a gold-alloy (Au-alloy). The additional transparent conductive layer may be formed of ITO or IZO while suppressing the oxidation of the reflective layer.

The cathode 160 may include a transparent conductive material, for example, indium tin oxide (ITO), indium zinc oxide (IZO), tin oxide ($SnO_2$), or zinc oxide (ZnO), like the anode 110. On the other hand, the cathode 160 may be formed of a transparent or reflective metal thin film, for example lithium (Li), magnesium (Mg), aluminum (Al), aluminum-lithium (Al—Li), calcium (Ca), magnesium-indium (Mg—In), magnesium-silver (Mg—Ag), or calcium (Ca)-aluminum (Al), without limitation.

The hole injection/transport layer 120 makes holes efficiently transfer between the anode 110 and the emission layer 130. The hole injection/transport layer 120 may be formed as a layer separately including a hole injection layer (HIL) and a hole transport layer (HTL), or it may be formed as one layer. Non-limiting examples of a hole injection material may include copper phthalocyanine (CuPc) or Starburst-type amines. Non limiting examples of a hole transport material may include 1,3,5-tricarbazolylbenzene, 4,4'-biscarbazolyl-biphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N-di(naphthalen-1-yl)-N,N-diphenyl benzidine (α-NPD), N,N'-diphenyl-N,N'-bis(1-naphthyl)-(1,1'-biphenyl)-4,4'-diamine (NPB), IDE320 (produced by IDEMITSU), poly(9,9-dioctylfluorene-co-N-(4-butylphenyl)diphenylamine) (TFB) or poly(9,9-dioctylfluorene-co-bis-N,N-phenyl-1,4-phenylenediamine (PFB), and the like.

The emission layer 130 may be formed of an organic material that emits red (R), green (G) or blue (B). In some embodiments, a material doped with a dopant, such as 4,4'-N,N'-dicarbazol-biphenyl (CBP) doped with bis(2-(2'-benzo[4,5-a]thienyl)pyridinato-N,C3')iridium (BTPIr) or $Ir(piq)_3$ may be used as the organic material that emits red.

When an excellent light emitting material and also excellent electron light emitting material is selected as a material for forming the emission layer 130, the organic light emitting device can operate in a dual mode.

The electron acceptor layer 140 may be formed of a material selected from the group consisting of fullerene, methanofullerene, doped fullerene, doped methanofulleren, a derivative thereof, and a mixture thereof. Non-limiting examples of doped fullerene or methanofulleren include fullerene or methanofulleren doped with an organic n-impurity. Non-limiting examples of the organic n-impurity include pyronine B or dicarbocyanine iodine. Non-limiting examples of fullerent or methanofulleren derivatives methanofulleren including an ethyleneoxy group disclosed in Korean Patent Laid-Open Publication No. 2009-0113607, or methanofulleren substituted with a fluorine group disclosed in Korean Patent Laid-Open Publication No. 2009-0061613.

The electron acceptor layer 140 may have a thickness ranging from about 10 Å to about 100 Å or less. The electron acceptor layer 140 may efficiently implant electrons when the thickness of the electron acceptor layer 140 exceeds about 10 Å, and the increase in the driving voltage may be suppressed when the thickness of the electron acceptor layer 140 is about 100 Å or less. Particularly, when there is only the electron acceptor layer 140, the electron acceptor layer 140 may have a thickness of about 10 Å to about 50 Å because the tunneling of electrons has to be possible.

The electron transport layer (ETL) 150 may include Li, Cs, Mg, LiF, CsF, $MgF_2$, NaF, KF, $BaF_2$, $CaF_2$, $Li_2O$, BaO, $Cs_2CO_3$, $Cs_2O$, CaO, MgO or lithium quinolate. The electron transport layer (ETL) 150 may have a thickness ranging from about 10 Å to about 100 Å. The electron acceptor layer 140 may efficiently implant electrons when the thickness of the electron acceptor layer 140 is about 10 Å or more, and the electron acceptor layer 140 may suppress the increase of driving voltage when the thickness of the electron acceptor layer 140 is about 100 Å or less.

Meanwhile, the total thickness of the electron transport layer (ETL) 150 and the electron acceptor layer 140 may range from about 50 Å to about 350 Å. Electrons may be efficiently implanted when the total thickness exceeds 50 Å, and the increase in the driving voltage may be suppressed when the total thickness is about 200 Å or less.

Figure 2:
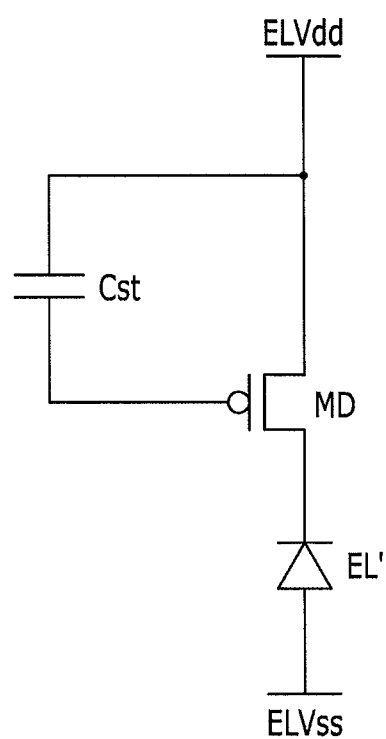
FIG. 2 is a view showing a pixel circuit of the dual mode organic light emitting device according to one embodiment.

FIG. 2 is a view showing a pixel circuit of the dual mode organic light emitting device according to one embodiment. Referring to FIG. 2, the pixel circuit of the embodiment of the present invention includes a capacitor (Cst), a P-type driving transistor (MD), and the dual mode organic light emitting device (EL') in accordance with the embodiment of the present invention that is described above.

The capacitor (Cst) applies a voltage corresponding to a data voltage to a gate of a driving transistor (MD). In this embodiment, a first terminal of the capacitor (Cst) is connected to a second terminal, which is either a source or a drain of a driving transistor (MD), and a second terminal of the capacitor (Cst) is connected to a gate of the driving transistor (MD).

The driving transistor (MD) applies a current corresponding to a voltage between the source and the gate to the dual mode organic light emitting device (EL'). The source may be either the first terminal or the second terminal of the driving transistor (MD). When the dual mode organic light emitting device (EL') operates in a normal mode, that is, when the first power source (ELVdd) has a lower voltage level than the second power source (ELVss), the first terminal of the driving transistor (MD), which is a terminal connected to a cathode terminal of the dual mode organic light emitting device (EL'), corresponds to the source. Also, when the dual mode organic light emitting device (EL') operates in a reflective mode, that is, when the first power source (ELVdd) has a higher voltage level than the second power source (ELVss), the second terminal of the driving transistor (MD), that is a terminal to which a first power source (ELVdd) is applied, corresponds to the source.

In this embodiment, the gate of the driving transistor (MD) is connected to the second terminal of the capacitor (Cst), and the first terminal of the driving transistor (MD) is connected to the cathode terminal of the dual mode organic light emitting device (EL'). The first power source (ELVdd) is applied to the second terminal of the driving transistor (MD).

In this embodiment, the cathode terminal of the dual mode organic light emitting device (EL') is electrically connected to the first terminal of the driving transistor (MD). Herein, electrical connection means not only a direct connection between the cathode terminal of the dual mode organic light emitting device (EL') and the first terminal of the driving transistor (MD), which is illustrated in the drawing, but also includes a case where even though there is another transistor between the cathode terminal of the dual mode organic light emitting device (EL') and the first terminal of the driving transistor (MD), current flows between the cathode terminal of the dual mode organic light emitting device (EL') and the first terminal of the driving transistor (MD) through the operation of the interposed transistor.

With this structure, a pixel circuit including the dual mode organic light emitting device according to a first Example operates in a dual mode, as the capacitor (Cst) applies a voltage corresponding to the gate of the driving transistor (MD), and the driving transistor (MD) applies a current corresponding to the voltage between the gate and the source to the dual mode organic light emitting device (EL'), and the dual mode organic light emitting device (EL') emits light according to the supplied current in a normal mode and absorbs light in a reflective mode.

The pixel circuit including the dual mode organic light emitting device in accordance with the embodiment is advantageous in that it may decrease the swing range of the gate voltage of the driving transistor needed for an operation in a reflective mode, compared with the conventional pixel circuit. Also, when the swing range of the gate voltage of the driving transistor is decreased, the swing range of the data voltage is decreased and thus power consumption is decreased, which is advantageous as well.

Figure 3:
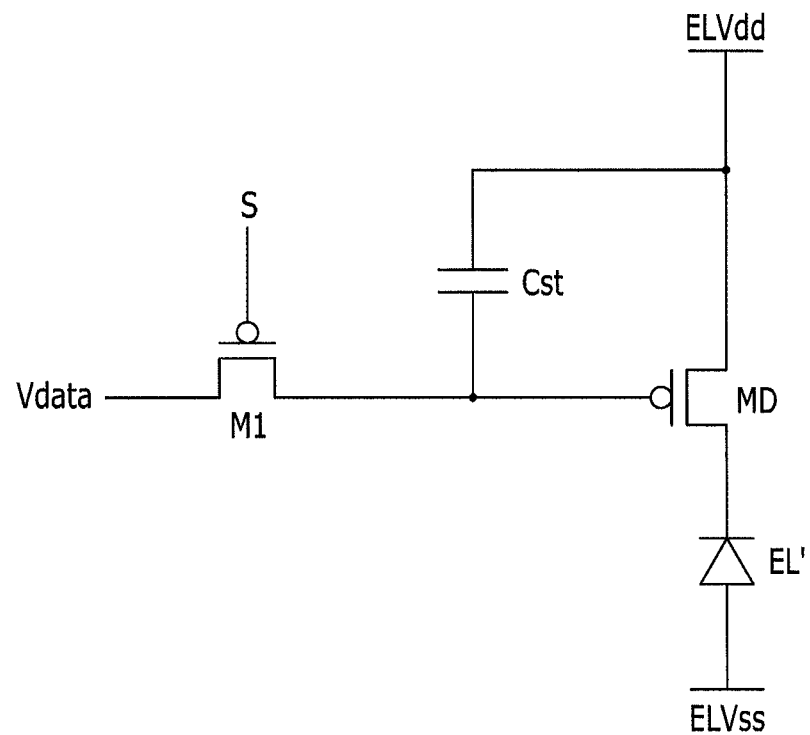
FIG. 3 is a view showing a pixel circuit of the dual mode organic light emitting device according to one embodiment.

FIG. 3 is a view showing a pixel circuit of the dual mode organic light emitting device according to one embodiment. Since the pixel circuit of FIG. 3 is similar to the pixel circuit including the dual mode organic light emitting device according to the embodiment shown in FIG. 2, except that the first transistor M1 is added, the first transistor M1 is additionally described for better understanding and ease of description.

Referring to FIG. 3, when a scan signal (S) is applied, that is, when the scan signal (S) is of a low-level voltage, the first transistor M1 is turned on to apply a data voltage Vdata to the second terminal of the capacitor (Cst) to charge the capacitor (Cst) with charges corresponding to the data voltage. Also, when the scan signal (S) is not applied, that is, when the scan signal (S) is a high-level voltage, the first transistor M1 is turned off to make the capacitor (Cst) maintain the charges. Accordingly, the capacitor (Cst) continuously supply the voltage corresponding to the data voltage Vdata to the driving transistor (MD) while the scan signal (S) is not applied.

In the embodiment, a case where the first transistor M1 is a P-type transistor is described, but the first transistor M1 may be an N-type transistor, and in this case, when the scan signal (S) is a high-level voltage, the first transistor M1 is turned on, and when the scan signal (S) is a low-level voltage, the first transistor M1 is turned off.

Figure 4:
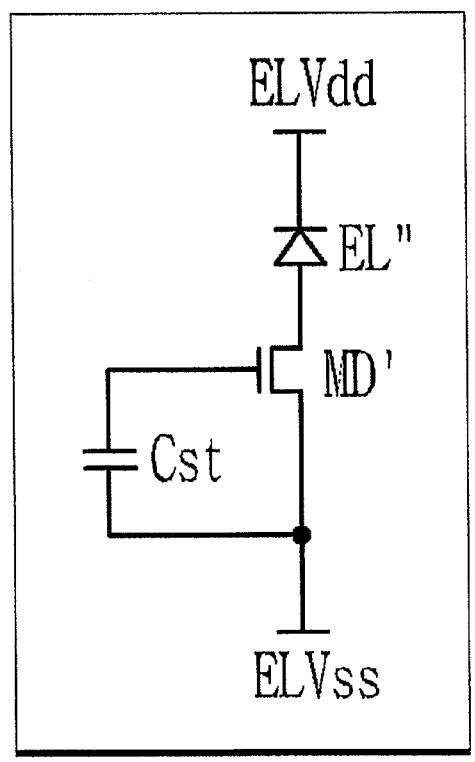
FIG. 4 is a view showing a pixel circuit of the dual mode organic light emitting device according to one embodiment.

FIG. 4 is a view showing a pixel circuit of the dual mode organic light emitting device according to one embodiment. Referring to FIG. 4, the pixel circuit according to the embodiment includes a capacitor (Cst), an N-type driving transistor (MD') and a dual mode organic light emitting device (EL").

The capacitor (Cst) applies a voltage corresponding to a data voltage to a gate of the driving transistor (MD'). In this embodiment, the first terminal of the capacitor (Cst) is connected to a second terminal, which is either a source or a drain of the driving transistor (MD'), and the second terminal of the capacitor (Cst) is connected to a gate of the driving transistor (MD').

The N-type driving transistor (MD') applies a current corresponding to the voltage between a source and a gate to the dual mode organic light emitting device (EL"). The source may be either the first terminal or the second terminal of the driving transistor (MD'). When the dual mode organic light emitting device (EL") operates in a normal mode, that is, when the voltage level of the first power source (ELVdd) lower than the voltage level of a second power source (ELVss), the first terminal of the driving transistor (MD'), that is, a terminal connected to an anode terminal of the dual mode organic light emitting device (EL"), corresponds to the source. Also, when the dual mode organic light emitting device (EL") operates in a reflective mode, that is, when the first power source (ELVdd) has a higher voltage level than the second power source (ELVss), the second terminal of the driving transistor (MD'), that is, a terminal to which the second power source (ELVss) is applied, corresponds to the source. In the embodiment, the gate of the driving transistor (MD') is connected to the second terminal of the capacitor (Cst), and the second power source (ELVss) is applied to a second terminal of the driving transistor (MD'), and the first terminal of the driving transistor (MD') is connected to an anode terminal of the dual mode organic light emitting device (EL").

In this embodiment, the anode terminal of the dual mode organic light emitting device (EL") is electrically connected to the first terminal of the driving transistor (MD'). Herein, electrical connection means not only a direct connection between the anode terminal of the dual mode organic light emitting device (EL") and the first terminal of the driving transistor (MD'), as illustrated in the drawing, but also includes a case where there is another transistor between the anode terminal of the dual mode organic light emitting device (EL") and the first terminal of the driving transistor (MD'), current may flow between the anode terminal of the dual mode organic light emitting device (EL") and the first terminal of the driving transistor (MD') through the operation of the transistor interposed therebetween.

With the structure, a pixel circuit including the dual mode organic light emitting device according to a third Example operates in a dual mode, as the capacitor (Cst) applies a voltage corresponding to a data voltage to the gate of the driving transistor (MD'), and the driving transistor (MD') applies a current corresponding to a voltage between the gate and the source to the dual mode organic light emitting device (EL"), and the dual mode organic light emitting device (EL") emits light according to the supplied current in a normal mode and absorbs light in a reflective mode.

The pixel circuit including the dual mode organic light emitting device according to the embodiment is a modification of the pixel circuit according to the embodiment of the present invention illustrated in FIG. 2, which is obtained by modifying the pixel circuit of FIG. 2 according to an N-type transistor. The pixel circuit has the same advantage that it may decrease the swing range of the gate voltage of the driving transistor, just like the pixel circuit according to the embodiment illustrated in FIG. 2. Also, when the swing range of the gate voltage of the driving transistor is decreased, the swing range of the data voltage is decreased and accordingly, power consumption is reduced as well, which is advantageous.

Figure 5:
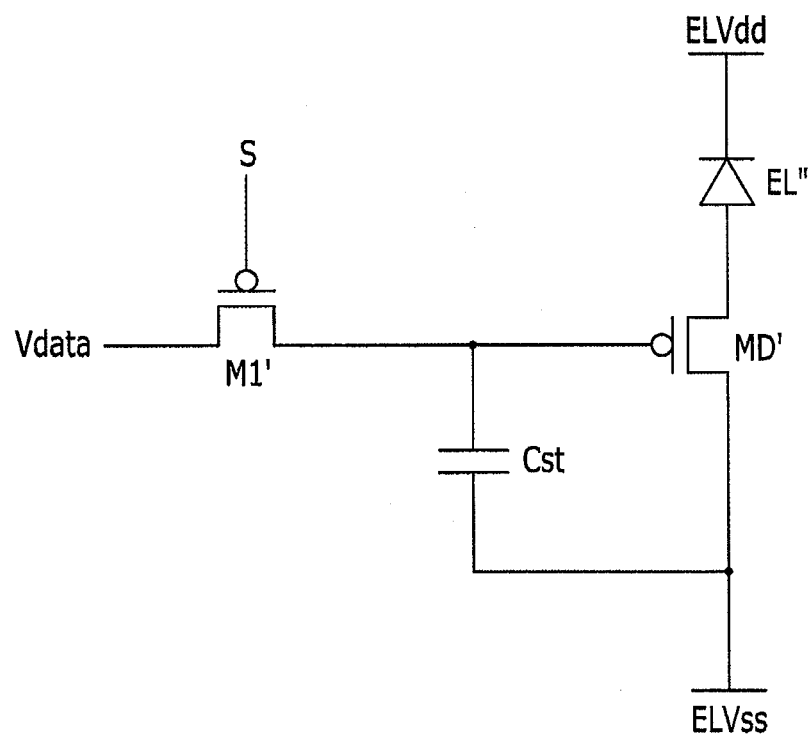
FIG. 5 is a view showing a pixel circuit of the dual mode organic light emitting device according to one embodiment.

FIG. 5 is a view showing a pixel circuit of the dual mode organic light emitting device according to one embodiment. The pixel circuit of FIG. 5 is similar to the pixel circuit including the dual mode organic light emitting device in accordance with the embodiment illustrated in FIG. 4, except that a first transistor (M1') is added. Hereafter, the first transistor (M1') is additionally described for better understanding and ease of description.

Referring to FIG. 5, when a scan signal (S) is applied, that is, when the scan signal (S) is a high-level voltage, the first transistor (M1') is turned on to apply a data voltage Vdata to a second terminal of the capacitor (Cst) and charge the capacitor (Cst) with charges corresponding to the data voltage. Also, when the scan signal (S) is not applied, that is, when the scan signal (S) is a low-level voltage, the first transistor (M1') is turned off to make the capacitor (Cst) maintain the charges. Accordingly, the capacitor (Cst) continuously applies a voltage corresponding to the data voltage Vdata to the N-type driving transistor (MD') while the scan signal (S) is not applied.

In this embodiment, a case where the first transistor (M1') is an N-type transistor, but the first transistor (M1') may be a P-type transistor. When the first transistor (M1') may be a P-type transistor and the scan signal (S) is a low-level voltage, the first transistor (M1') is turned on, and when the scan signal (S) is a high-level voltage, the first transistor (M1') is turned off.

The following examples illustrate various embodiments. These examples, however, are not in any sense to be interpreted as limiting the scope of this disclosure.

Fabrication of Dual Mode Organic Light Emitting Device

Hereinafter, examples of the dual mode OLED are described by referring to the drawings.

EXAMPLE 1

Cathode (Weight Ratio of Mg:Ag=30:1)

A glass substrate coated with an ITO (Indium tin oxide) thin film in a thickness of 1500 Å was cleaned with distilled water ultrasonic wave. After the cleaning with distilled water was finished, the glass substrate coated with the ITO thin film was cleaned with an ultrasonic wave by using a solvent such as isopropyl alcohol, acetone, or methanol, dried, transferred to a plasma cleaner, cleaned by using oxygen plasma for 5 minutes, and then transferred to a vacuum deposition equipment so as to produce an ITO transparent electrode. A hole injection layer (HIL) having a thickness of 1200 Å was formed by using the ITO transparent electrode as a positive electrode and performing a vacuum deposition of a HTM compound, which is described below, onto the upper part of the ITO substrate.

An emission layer having a thickness of 300 Å was formed by using the material prepared according to Example 1 as a host, doping the upper part of the hole transport layer (HTL) with 7 wt % of a PhGD compound as a phosphorescence green dopant, and performing a vacuum deposition.

Subsequently, an electron transport layer (ETL) was formed by stacking a BAlq [bis(2-methyl-8-quinolinolato-N1,O8)-(1,1'-biphenyl-4-olato)aluminum] compound in a thickness of 50 Å, and then sequentially depositing a bis(10-hydroxyben-zo[h]quinolinato)beryllium (Bebq2) compound in a thickness of 250 Å on the upper part of the emission layer. An organic light emitting device was fabricated by forming a cathode by sequentially depositing LiF in a thickness of 5 Å and Al in a thickness of 1000 Å on the upper part of the electron transport layer (ETL).

EXAMPLE 2

Cathode (Weight Ratio of Mg:Ag=10:1)

A dual mode organic light emitting device was fabricated according to the same method as Example 1, except that the weight ratio of the cathode was changed from Mg:Ag=30:1 to Mg:Ag=10:1.

EXPERIMENTAL EXAMPLE

Measurement Method

Changes in current density, luminance, and luminous efficiency of the above-fabricated organic light emitting devices were measured according to voltage. Specific measurement methods were as follows.

1) Measurement of variation of current density according to voltage variation.

For each of the fabricated organic light emitting devices, the current value flowing through a unit device was measured with a current-voltage measurement instrument (Keithley 2400) by increasing voltage from 0 V to 14 V, and the measured current value was divided by area.

2) Measurement of variation of luminance according to voltage variation

For each of the fabricated organic light emitting devices, luminance was measured with a luminance meter (Minolta Cs-1000A) by increasing voltage from 0 V to 14 V.

3) Measurement of electric power efficiency

Electric power efficiency was calculated based on the current density and the luminance measured in the 1) and 2) and the voltage.

Measurement Result

The device data of the dual mode organic light emitting devices according to Examples 1 and 2 were shown in the following Table 1.

TABLE 1

|  | Normal mode driving voltage (V) | Normal mode current density (mA/cm$^2$) | Luminance (cd/m$^2$) | Color coordinate CIEx | Color coordinate CIEy | Reflective mode driving voltage (V) |
|---|---|---|---|---|---|---|
| Example 1 | 4.5 | 64.1388 | 205.6 | 0.6672 | 0.3319 | −6.5 |
| Example 2 | 4 | 142.795 | 317.4 | 0.6672 | 0.3319 | −7 |

It may be seen from Table 1 that the dual mode organic light emitting devices of Examples 1 and 2 had as low driving voltage as 6.5 or 7V in the reflective mode.

Comparison of Current Amount

Figure 6:
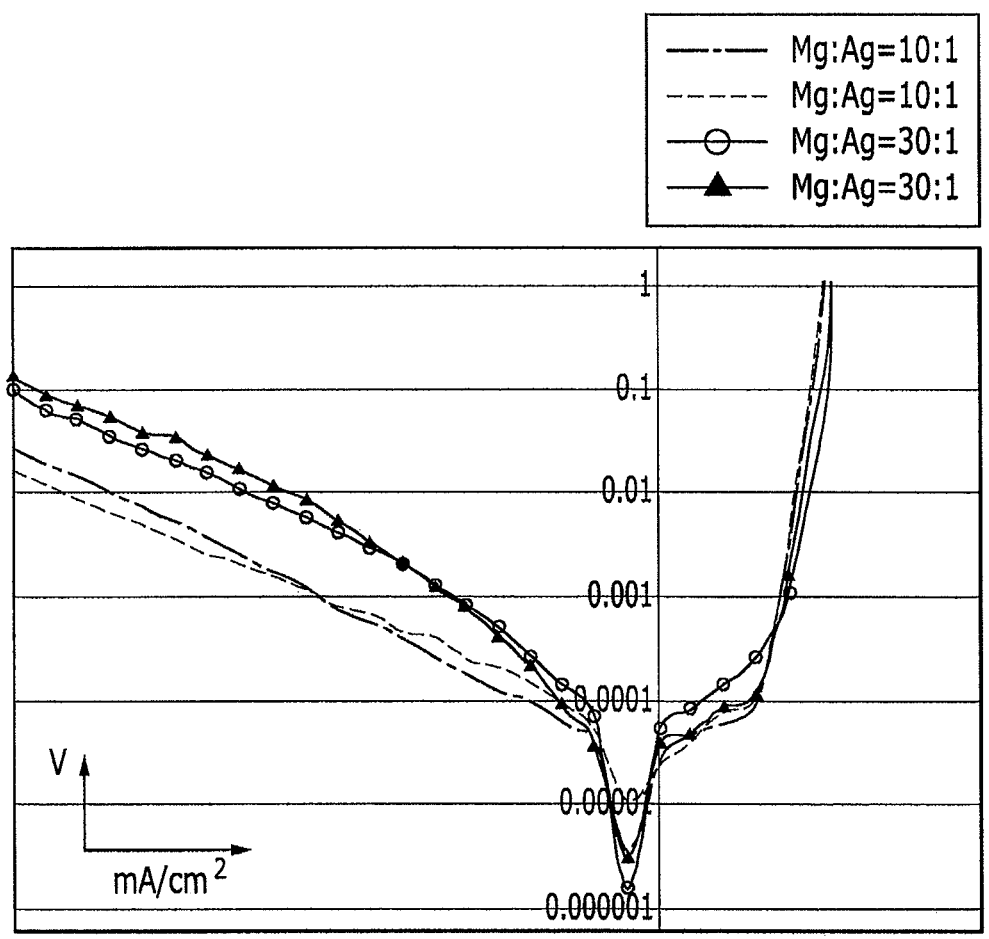
FIG. 6 shows data obtained by measuring the amount of current in a reflective mode of Examples 1 and 2.

FIG. 6 shows data obtained by measuring the amount of current in a reflective mode of Examples 1 and 2. Generally, the quenching amount in the reflective mode is in proportion to quenching current. When comparison is made in terms of voltage by comparing the current amounts in FIG. 6, the case of Example 1 is more advantageous than the case of Example 2 in terms of voltage.

While various features have been described in connection with what is presently considered to be practical exemplary embodiments, it is to be understood that the invention is not limited to the disclosed embodiments, but, on the contrary, is intended to cover various modifications and equivalent arrangements. Therefore, the aforementioned embodiments should be understood to be exemplary but not limiting this disclosure in any way.

What is claimed is:

1. A dual mode organic light emitting device, comprising:
   a cathode and an anode;
   an emission layer interposed between the cathode and the anode; and
   an electron transport layer (ETL) interposed between the cathode and the emission layer;
   wherein the cathode comprises a first metal selected from silver (Ag), aluminum (Al), copper (Cu), and gold (Au) and a second metal having a work function of about 4.0 eV or less, and
   the first metal and the second metal are present at a weight ratio of about 1:10 to about 1:100,
   a driving transistor configured to apply a current to the cathode; and
   a capacitor configured to apply a voltage corresponding to a data voltage to a gate of the driving transistor,
   wherein a first terminal of the driving transistor is electrically connected to the cathode, a first power source is applied to a second terminal of the driving transistor, and a second power source is applied to the anode,
   wherein when the dual mode organic light emitting device operates in a normal mode the first power source has a lower voltage level than the second power source, and when the dual mode organic light emitting device operates in a reflective mode, the first power source has a higher voltage level than the second power source.

2. The dual mode organic light emitting device of claim 1, wherein the second metal comprises at least one of magnesium (Mg), calcium (Ca), ytterbium (Yb), and barium (Ba), or a combination thereof.

3. The dual mode organic light emitting device of claim 1, wherein the first metal and the second metal are present at a weight ratio of about 1:30.

4. The dual mode organic light emitting device of claim 1, wherein the first metal and the second metal are present at a weight ratio of about 1:10 to about 1:30.

5. A pixel circuit, comprising:
   a dual mode organic light emitting device comprising:
   a cathode and an anode;
   an emission layer interposed between the cathode and the anode; and
   an electron transport layer (ETL) interposed between the cathode and the emission layer;
   wherein the cathode comprises a first metal selected from silver (Ag), aluminum (Al), copper (Cu), and gold (Au) and a second metal having a work function of about 4.0 eV or less, and the first metal and the second metal are present at a weight ratio between more than about 1:10 and about 1:100 or less;
   a P-type driving transistor configured to apply a current to the cathode of the dual mode organic light emitting device; and
   a capacitor configured to apply a voltage corresponding to a data voltage to a gate of the driving transistor,
   wherein a first terminal of the P-type driving transistor is electrically connected to the cathode of the dual mode organic light emitting device, a first power source is applied to a second terminal of the P-type driving transistor, and a second power source is applied to the anode terminal of the dual mode organic light emitting device,
   wherein when the dual mode or organic light emitting device operates in a normal mode, the first power source has a lower voltage level than the second power source, and when the dual mode or organic light emitting device operates in a reflective mode, the first power source has a higher voltage level than the second power source.

6. The pixel circuit of claim 5, further comprising a first transistor configured to apply the data voltage to the capacitor in response to a scan signal.

7. A pixel circuit, comprising:
   a dual mode organic light emitting device comprising:
   a cathode and an anode;
   an emission layer interposed between the cathode and the anode; and
   an electron transport layer (ETL) interposed between the cathode and the emission layer;
   wherein the cathode comprises a first metal selected from silver (Ag), aluminum (Al), copper (Cu), and gold (Au) and a second metal having a work function of about 4.0 eV or less, and the first metal and the second metal are present at a weight ratio between more than about 1:10 and about 1:100 or less;
   an N-type driving transistor configured to apply a current to an anode of the dual mode organic light emitting device; and
   a capacitor configured to apply a voltage corresponding to a data voltage to a gate of the driving transistor,
   wherein a first terminal of the N-type driving transistor is electrically connected to the anode of the dual mode or organic light emitting device, a first power source is applied to a second terminal of the N-type driving transistor, and a second power source is applied to a cathode terminal of the dual mode organic light emitting device,
   wherein when the dual mode organic light emitting device operates in a normal mode, the first power source has a lower voltage level than the second power source, and when the dual mode organic light emitting device operates in a reflective mode, the first power source has a higher voltage level than the second power source.

8. The pixel circuit of claim 7, further comprising a first transistor configured to apply the data voltage to the capacitor in response to a scan signal.

* * * * *